United States Patent
Tatta et al.

(10) Patent No.: US 9,521,782 B2
(45) Date of Patent: Dec. 13, 2016

(54) SYSTEMS AND METHODS FOR PASSIVE COOLING OF COMPONENTS WITHIN ELECTRICAL DEVICES

(71) Applicant: General Electric Company, Schenectady, NY (US)

(72) Inventors: Anthony Dominic Tatta, Rochester, NY (US); Jonathan Vilagy, Akron, NY (US); Craig Andrew Peterson, Penfield, NY (US)

(73) Assignee: General Electric Company, Schenectady, NY (US)

( * ) Notice: Subject to any disclaimer, the term of this patent is extended or adjusted under 35 U.S.C. 154(b) by 285 days.

(21) Appl. No.: 14/316,575

(22) Filed: Jun. 26, 2014

(65) Prior Publication Data
US 2015/0382508 A1    Dec. 31, 2015

(51) Int. Cl.
*H05K 7/20* (2006.01)

(52) U.S. Cl.
CPC ...... *H05K 7/20409* (2013.01); *H05K 7/20545* (2013.01); *H05K 7/20509* (2013.01)

(58) Field of Classification Search
CPC ............... H05K 1/0204; H05K 3/0061; H05K 2201/09054; H05K 1/182; H05K 1/0203; H05K 1/021; H05K 7/20509; H05K 7/20409; H05K 7/20436; H05K 7/20545; G06F 1/20; G06F 1/203; G06F 1/183
USPC .......................... 361/679.47, 716, 719–721, 729–733, 361/785–791
See application file for complete search history.

(56) References Cited

U.S. PATENT DOCUMENTS

| | | | |
|---|---|---|---|
| 5,181,167 A | 1/1993 | Davidson et al. | |
| 5,550,710 A | 8/1996 | Rahamim et al. | |
| 6,141,211 A * | 10/2000 | Strickler ................. | G06F 1/184 361/679.31 |
| 6,181,553 B1 * | 1/2001 | Cipolla ................. | G06F 1/1632 165/104.33 |
| 6,472,785 B2 | 10/2002 | Petit et al. | |
| 6,504,722 B2 | 1/2003 | Vittet et al. | |
| 6,665,184 B2 * | 12/2003 | Akselband ................ | F28F 3/12 165/104.33 |

(Continued)

FOREIGN PATENT DOCUMENTS

WO    2008114444 A1    9/2008

OTHER PUBLICATIONS

European Search Report and Opinion issued in connection with corresponding EP Application No. 15172718.7 on Nov. 3, 2015.

*Primary Examiner* — Adam B Dravininkas
(74) *Attorney, Agent, or Firm* — Armstrong Teasdale LLP

(57) ABSTRACT

A system includes an electrical enclosure, a first electrical unit, a first electrical module, a first heat spreader, and a heat sink. The first electrical unit is removably disposed within the electrical enclosure, and the first electrical unit includes a first surface opposite to a second surface. The first electrical module is removably disposed within the first electrical unit, and the first electrical module is inserted into the first electrical unit in a first direction from the first surface to the second surface. The first heat spreader is coupled to the first electrical module, and the first heat spreader comprises a first tapered coupling. The heat sink includes a second tapered coupling. The second tapered coupling is couples with the first tapered coupling of the first heat spreader to form a physical thermal connection that facilitates heat transfer between the first electrical module and the heat sink.

20 Claims, 6 Drawing Sheets

(56) References Cited

U.S. PATENT DOCUMENTS

| | | | |
|---|---|---|---|
| 6,768,633 B2 | 7/2004 | Chuang | |
| 6,796,372 B2* | 9/2004 | Bear | F28F 13/00 |
| | | | 165/104.21 |
| 7,187,342 B2 | 3/2007 | Heisen et al. | |
| 7,344,919 B2 | 3/2008 | McAllister et al. | |
| 7,751,192 B2 | 7/2010 | Abul-Haj et al. | |
| 8,305,754 B2* | 11/2012 | Wu | H05K 7/20781 |
| | | | 165/104.21 |
| 8,427,828 B2 | 4/2013 | Kehret et al. | |
| 2001/0015583 A1 | 8/2001 | Petit et al. | |
| 2002/0185262 A1* | 12/2002 | Baer | F28F 13/00 |
| | | | 165/104.22 |
| 2003/0181075 A1* | 9/2003 | Hartke | H05K 1/141 |
| | | | 439/67 |
| 2004/0095713 A1 | 5/2004 | Chuang | |
| 2005/0219137 A1 | 10/2005 | Heisen et al. | |
| 2006/0193114 A1* | 8/2006 | Faneuf | H05K 7/20809 |
| | | | 361/689 |
| 2010/0020514 A1 | 1/2010 | Lee et al. | |
| 2011/0049749 A1 | 3/2011 | Bailey et al. | |
| 2011/0187188 A1* | 8/2011 | Yang | H02M 7/04 |
| | | | 307/31 |
| 2012/0020017 A1* | 1/2012 | Kehret | G06F 1/183 |
| | | | 361/679.54 |
| 2012/0026668 A1* | 2/2012 | Landon | G06F 1/184 |
| | | | 361/679.31 |
| 2012/0170224 A1* | 7/2012 | Fowler | H05K 7/1424 |
| | | | 361/720 |
| 2013/0182389 A1 | 7/2013 | Demange et al. | |
| 2013/0194755 A1 | 8/2013 | Ling et al. | |

* cited by examiner

SYSTEMS AND METHODS FOR PASSIVE COOLING OF COMPONENTS WITHIN ELECTRICAL DEVICES

BACKGROUND

The subject matter disclosed herein relates to systems and methods for the passive cooling of electrical components, such as electrical components disposed within industrial communications systems.

Electrical components disposed within electrical and/or electro-mechanical systems, such as industrial communications systems, generate large amounts of heat. Such systems may be organized into a wide variety of electrical enclosures (e.g., electrical cabinets, electrical racks, etc.) that have a limited amount of space for the electrical components disposed therein. Indeed, the components disposed within these electrical enclosures may be densely packed within the limited amount of space, thereby leading to various thermal effects, such as thermal degradation of the electrical components.

Accordingly, various heat dissipation techniques may be utilized within the electrical enclosures to help reduce the thermal effects on the electrical components. In some situations, active techniques related to air-cooling and/or water-cooling may be utilized to dissipate heat within these electrical systems. However, such techniques involve additional components, such as fans, filters, etc., that may increase the manufacturing cost, increase maintenance costs, occupy portions of the limited amount of space, or reduce the operating efficiency of the electrical systems.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes an electrical enclosure, a first electrical unit, a first electrical module, a first heat spreader, and a heat sink. The first electrical unit is removably disposed within the electrical enclosure, and the first electrical unit includes a first surface opposite to a second surface. The first electrical module is removably disposed within the first electrical unit, and the first electrical module is inserted into the first electrical unit in a first direction from the first surface to the second surface. The first heat spreader is coupled to the first electrical module within the first electrical unit, and the first heat spreader comprises a first tapered coupling. The heat sink includes a second tapered coupling, and the heat sink is parallel to the second surface of the first electrical unit. The second tapered coupling is couples with the first tapered coupling of the first heat spreader to form a physical thermal connection that facilitates heat transfer between the first electrical module and the heat sink.

In a second embodiment, a system includes an electrical unit, a plurality of electrical modules, a plurality of heat spreaders, and a heat sink. The electrical unit includes a first surface opposite a second surface. The plurality of electrical modules are disposed within the electrical unit, and each electrical module of the plurality of electrical modules includes a heat generating structure. Each heat spreader of the plurality of heat spreaders is coupled to a respective electrical module of the plurality of electrical modules and to a corresponding heat generating structure. Each heat spreader includes a body portion with a flat surface, and the flat surface is in thermal contact with at least a portion of the corresponding heat generating structure. Each heat spreader also includes a shank portion with one or more protruding couplings. The heat sink is disposed parallel to the second surface of the electrical unit, and the heat sink comprises a plurality of couplings that operatively couple with the one or more protruding couplings of the plurality of heat spreaders to form a physical thermal connection that facilitates heat transfer between the plurality of electrical modules and the heat sink.

In a third embodiment, a method includes inserting an electrical module into an electrical unit in a first direction from a first surface of the electrical unit to a second surface of the electrical unit. The first surface is opposite to the second surface, and the electrical module includes one or more pins and a heat spreader. The method also includes establishing an electrical connection between the one or more pins of the electrical module and an electrical connector disposed on a backplane assembly of the electrical unit. The backplane assembly is disposed parallel to and proximate to the second surface of the electrical unit. The method also includes establishing a thermal connection between the heat spreader and a heat sink disposed adjacent to a second surface of the backplane assembly. The one or more protruding couplings of the heat spreader are configured to interface with one or more couplings disposed within heat sink.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
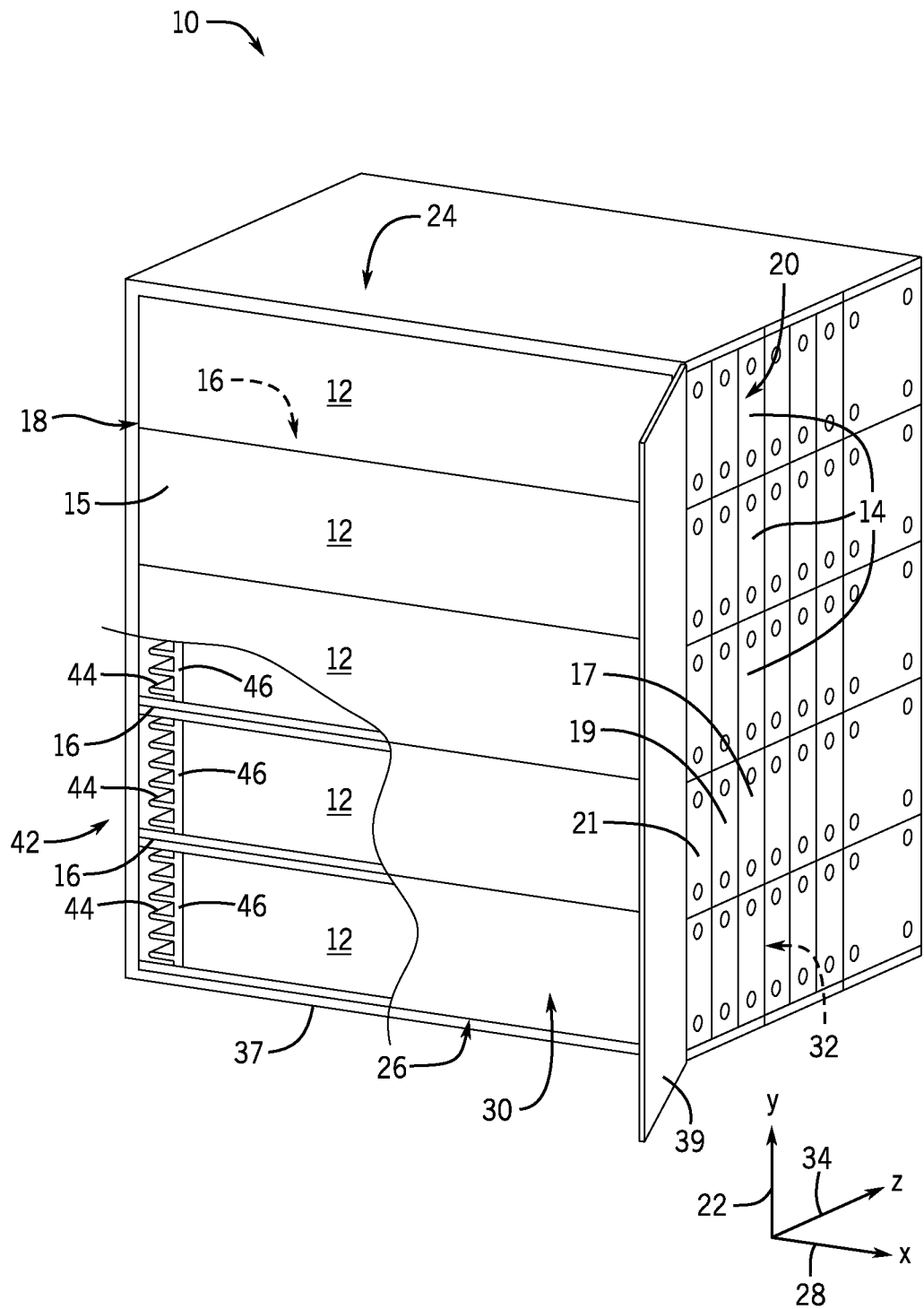
FIG. 1 is a cross-sectional view of an embodiment of an electrical enclosure having one or more electrical units.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The present disclosure generally relates to a thermal dissipation system that may be utilized with electrical equipment, and more specifically, that may be utilized with electrical communications equipment. For example, the thermal dissipation system described herein may dissipate thermal energy generated by electrical components used within a wide variety of industrial communications equipment, such as oil and gas communications equipment, wireless communications equipment, traffic control communications equipment, communications equipment utilized between electrical utilities, and so forth. In many situations, such equipment utilizes electrical enclosures (e.g., electrical racks) to house various electrical components. For example, a telecommunication rack having a chassis structure may be used to support one or more electrical units, and these electrical units may be organized as modular and/or removable sections (e.g., rack mountable units) of the telecommunications rack. Further, each electrical unit includes one or more electrical modules. Each electrical module may have one or more electrical connections with other electrical modules and/or other electrical units via a backplane assembly. Embodiments with a backplane assembly disposed in the electrical unit may facilitate electrical connections between electrical modules of the electrical unit, and embodiments with a backplane assembly disposed in the telecommunications rack may facilitate electrical connections between electrical units of the telecommunications rack.

As described in the present disclosure, the thermal dissipation system may be utilized within the electrical rack to facilitate heat transfer from the electrical modules to the surrounding medium (e.g., air). Specifically, the thermal dissipation system is utilized to dissipate heat generated by one or more electrical components disposed within the electrical rack. The thermal dissipation system may be disposed within the one or more electrical units of the telecommunications rack, and the thermal dissipation system includes a heat spreader and a heat sink. Further, each electrical module disposed within the one or more electrical units may include one or more heat generating devices (e.g., electrical equipment or components that generate heat during operation) operatively coupled to the heat spreader of the thermal dissipation system. In addition, a heat sink of the thermal dissipation system may be disposed proximate to the backplane assembly of each electrical unit. Accordingly, when the electrical unit is assembled within the rack and/or electrical connections are made between the electrical unit and the electrical modules, the heat spreader is operatively coupled to the heat sink. In this manner, the thermal dissipation system is configured to passively transfer and dissipate heat generated by the heat generating devices to the heat sink via the heat spreader.

With the foregoing in mind, FIG. 1 is a partial cross-sectional view of an embodiment of an electrical rack 10 (e.g., an electrical enclosure 10, a telecommunications rack 10, telecommunications cabinet 10, etc.) having one or more electrical units 12. The electrical units 12 (e.g., rack mountable units) may be organized in a modular and/or sectional fashion, such that each unit 12 may be engaged (e.g., inserted) or disengaged (e.g., withdrawn) from the electrical rack 10. Further, each electrical unit 12 includes one or more electrical modules 14 that may be engaged (e.g., inserted) or disengaged (e.g., withdrawn) from the respective electrical unit 12. For example, an electrical unit may have a power supply module 17, a first radio module 19, and a second radio module 21. In particular, a chassis 16 of the electrical rack 10 provides the internal supporting structure and/or framework for the components of the electrical rack 10. For example, the chassis 16 may be configured to provide structural support for the one or more electrical units 12 respective electrical modules 14. For example, the chassis 16 may be configured to support approximately 1, 2, 3, 4, 5, 6, 7, 8, 9, 10, or more electrical units 12.

The electrical rack 10 includes one or more surfaces (e.g., front, back, top, bottom, left, right, etc.) that form an exterior shell 15 or housing 15 of the electrical rack 10. The shell 15 of the rack 10 may be a thermally conductive shell 15 that is formed of metal, composite, or other thermally conducting material. Further, the electrical rack 10 includes a back end 18 and a front end 20 that are substantially parallel to each other along a vertical Y-axis 22. In some embodiments, the back end 18 may be open to the surrounding medium (e.g., air), may be a grating or a grill, and so forth. In addition, the electrical rack 10 includes a top end 24 and a bottom end 26 that are substantially parallel to each other along a horizontal X-axis 28. Further, the electrical rack 10 includes a left end 30 and a right end 32 that are substantially parallel and spaced apart along a Z-axis 34. In particular, the electrical unit 12 and/or the electrical modules 14 may be inserted (e.g., engaged, mounted, etc.) within the chassis 16 in a first direction 36 (e.g., along the X-axis 28) towards the back end 18 of the rack 10. Likewise, when the units 12 and/or the modules 16 are removed (e.g., disengaged, dismounted, etc.) from the chassis 16, they may be removed in a second direction 38 (e.g., along the X-axis 28) away from the back end 18 of the rack 10. In some embodiments, the electrical rack 10 includes a chassis cover 37 that includes one or more ends (e.g., the top end 24, the bottom end 26, the left end 30, or the right end 32) of the rack 10. The chassis cover 37 may be utilized to enclose an inner chassis volume 39 and/or to enclose the chassis 16. In some embodiments, the electrical rack 10 may include an enclosure door 39, which may be configured to enclosure the inner chassis volume 28 and/or the chassis 16.

In some embodiments, each electrical unit 12 is configured to hold one or more electrical modules 14. For example, each electrical unit 12 may hold 1, 2, 3, 4, 5, 6, 7, 8, 9, 10, or more electrical modules 14. In some embodiments, the electrical rack 10 with multiple electrical units 12, each electrical unit 12 having multiple electrical modules 14, may have between approximately 2 to 200, 3 to 100, 4 to 75, or 5 to 50 electrical modules 14 per electrical rack 10. The electrical modules 14 may be any type of telecommunications module, such as radio modules, power supply modules, wired communications module (e.g., fiber optic, coaxial), etc. The electrical units 12 may be mounted within the electrical rack 10 in a horizontal orientation (as illustrated in FIG. 1) or a vertical orientation. As noted above, the electrical modules 14 may be inserted into the chassis 16 in the first direction 36 towards the back end 18 of the rack 10. Moreover, the one or more electrical modules 14 may be mounted within the respective electrical unit 12 in a horizontal orientation or a vertical orientation (as illustrated in FIG. 1). In particular, the modules 14 may be inserted into the chassis 16 to make an electrical connection with a backplane assembly 46 of the rack 10. In certain embodiments, each module 14 may include an associated backplane assembly 46, and in other embodiments, one or more backplanes 46 (e.g., a shared or common backplane 46) may be utilized to couple one or more modules 14. Further, each module 14 may be secured via one or more retainers 40 (e.g., screws, knobs, levers, biased fasteners, latches, snap-fit fasteners, rails, etc.), as further described below with respect to FIG. 3.

In particular, in certain embodiments, a thermal dissipation system 42 is disposed within the electrical rack 10 to facilitate heat transfer away from one or more heat generating electrical components (e.g., electrical units 12, electrical modules 14) disposed within the rack 10, as further explained with respect to FIGS. 3-6. Specifically, the thermal dissipation system 42 includes a heat sink 44 and a heat spreader (illustrated in FIGS. 3-4). Particularly, the heat sink 44 is disposed along the back end 18 of the rack 10, proximate to the backplane assembly 46, and is configured to be operatively coupled with the heat spreader coupled to the electrical module 14. In certain embodiments, each module 14 may include an associated heat sink 44, and in other embodiments, one or more heat sinks 44 may be utilized to couple one or more modules 14. In this manner, when the electrical module 14 is inserted into the chassis 16, the heat spreader operatively couples with the heat sink 44 and facilitates the transfer of heat away from the electrical module 14 (as further described below). In some embodiments, the heat spreader operatively couples with the heat sink 44 to transfer heat from the electrical module 14 when electrical module 14 forms an electrical connection with the backplane.

Figure 2:
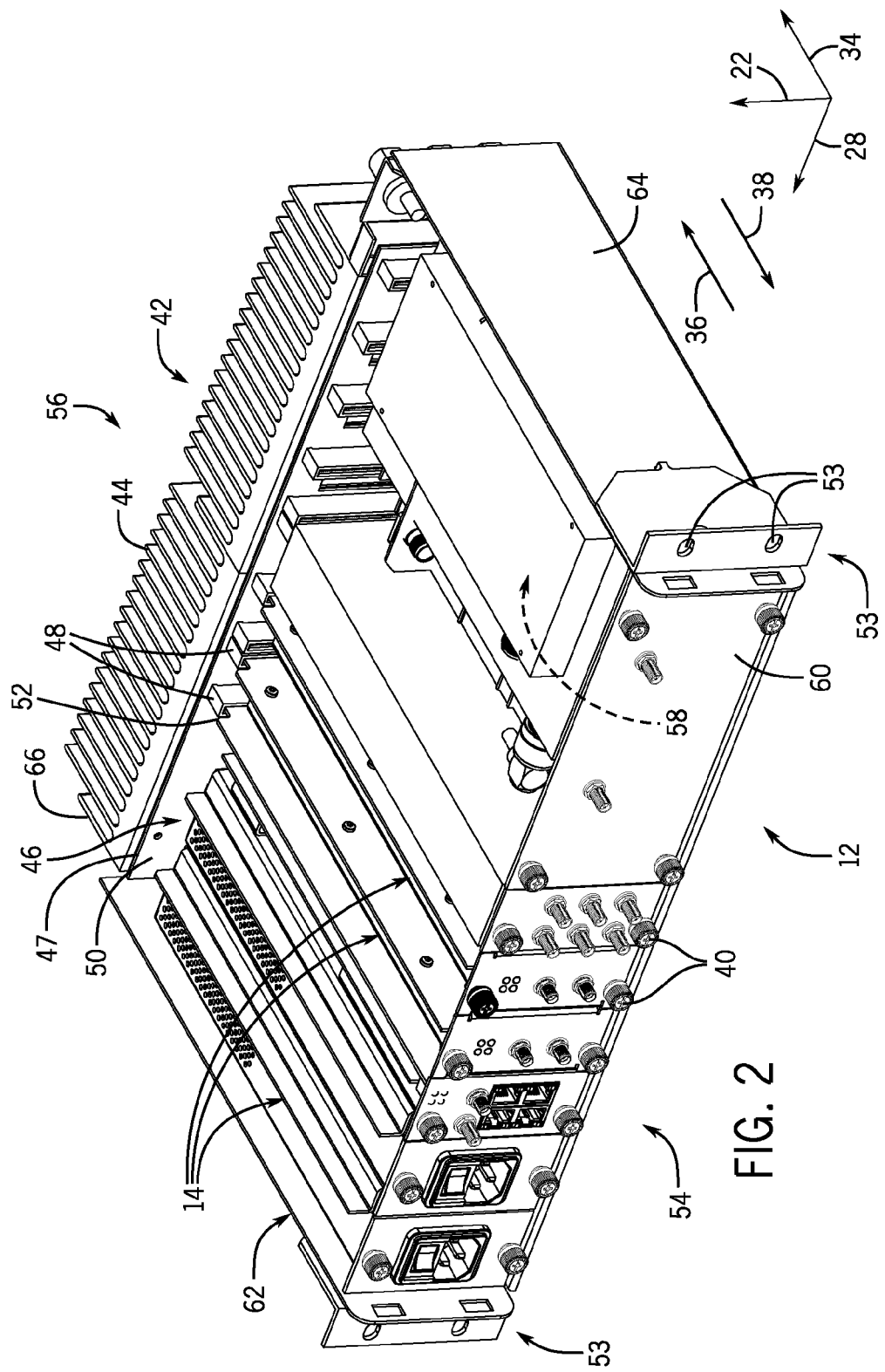
FIG. 2 is a perspective view of an embodiment of one or more electrical modules disposed within an electrical unit of FIG. 1.

FIG. 2 is a perspective view of an embodiment of electrical modules 14 disposed within one of the electrical units 12 illustrated in FIG. 1. As noted above, the electrical modules 14 may include various types of communications circuitry, such as radio frequency communications circuitry or wired communications circuitry. Moreover, the electrical modules 14 may be power supply modules, radio modules, processor-based units, servers, communications servers, storage units, or any type of module that provides communications functionality to the electrical rack 10. In particular, the electrical unit 12 includes the heat sink 44 of the thermal dissipation system 42. In certain embodiments, the heat sink 44 may be disposed along a backplane assembly 46. In some embodiments, the electrical unit 12 may have multiple heat sinks 44.

In some embodiments, the backplane assembly 46 is a group of electrical connectors configured connect and interface the one or more modules 14. For example, the backplane assembly 46 includes one or more electrical connectors 48 in parallel with each other and disposed substantially normal to a forward surface 50 of the backplane 47. The backplane 47 may include, but is not limited to, a printed circuit board, a protoboard, or any combination thereof. Accordingly, when the modules 14 are inserted into the unit 12 in the first direction 36 towards the backplane assembly 46, a pin end 52 of each module 14 is aligned to form an electrical connection with the electrical connectors 48. In addition, in certain embodiments, the one or more retainers 40 may be utilized to secure the modules 14 within the electrical unit 12, and more particularly, the one or more retainers 40 may be utilized to secure the electrical connection between the modules 14 and the backplane assembly 46. The retainers 40 may be screws, knobs, thumb-screws, rails, snap-fit fasteners, levers, biased fasteners, bolts, clips, or any other type of attachment. In particular, each module 14 may be associated with one or more retainers 40, such that the module 14 may be removed and/or inserted into the unit 12 independent of another module 14. Likewise, one or more retainers 40 may be disposed on front edges 53 of the electrical unit 12 in order to secure the unit 12 to the rack 10 (e.g., via the chassis structure 16). In particular, each unit 12 may be associated with one or more retaining features 53 such that the unit 12 may be removed and/or inserted into the chassis 16 or the rack 10 independent of another unit 12. In addition, the retaining features 53 may be moved along the X-axis 28 to adjust the depth of the unit 12 within the rack 10.

In certain embodiments, the electrical unit 12 illustrated in FIG. 1 includes one or more surfaces or walls (e.g., front, back, top, bottom, left, right, etc.) that form an exterior shell of the unit 12. For example, the unit 12 includes a front surface 54, a back surface 56, a top surface 58 (not illustrated to display the interior components of the electrical unit 12), a bottom surface 60, a left surface 62, and a right surface 64. When the electrical unit 12 is disposed within the electrical rack 10 with a horizontal orientation (as illustrated in FIG. 1), the front surface 54 is disposed along the front end 20 of the rack 10, the back surface 56 is disposed along the back end 18 of the rack 10, the top surface 58 is disposed parallel to the top end 24 of the rack 10, the bottom surface 60 is disposed parallel to the bottom end 26 of the rack 10, a left surface 62 is disposed along the left end 30 of the rack 10, and a right surface 64 is disposed along the right end 32 of the rack 10. In particular, the front surface 54 may include the one or more retainers 40 configured to secure the electrical modules 14 within each unit 12. That is, the retainers 40 may be configured to secure the electrical modules 14 to the front surface 54. Additionally, or in the alternative, one or more retainers 40 may be configured to secure the electrical modules to the back surface 56 and/or to the backplane assembly 46. Further, the back surface 56 of the unit 12 includes the heat sink 44 of the thermal dissipating system 42. In particular, the heat sink 44 is disposed adjacent to the backplane assembly 46 of the electrical unit 12, such that it is parallel to a rear surface 66 of the backplane 47. Indeed, a heat spreader coupled to each electrical module 14 may be configured to operatively connect the respective electrical module 14 to the heat sink 44 to dissipate heat generated by components disposed on the electrical module 14, as further explained below with respect to FIGS. 4-6.

Figure 3:
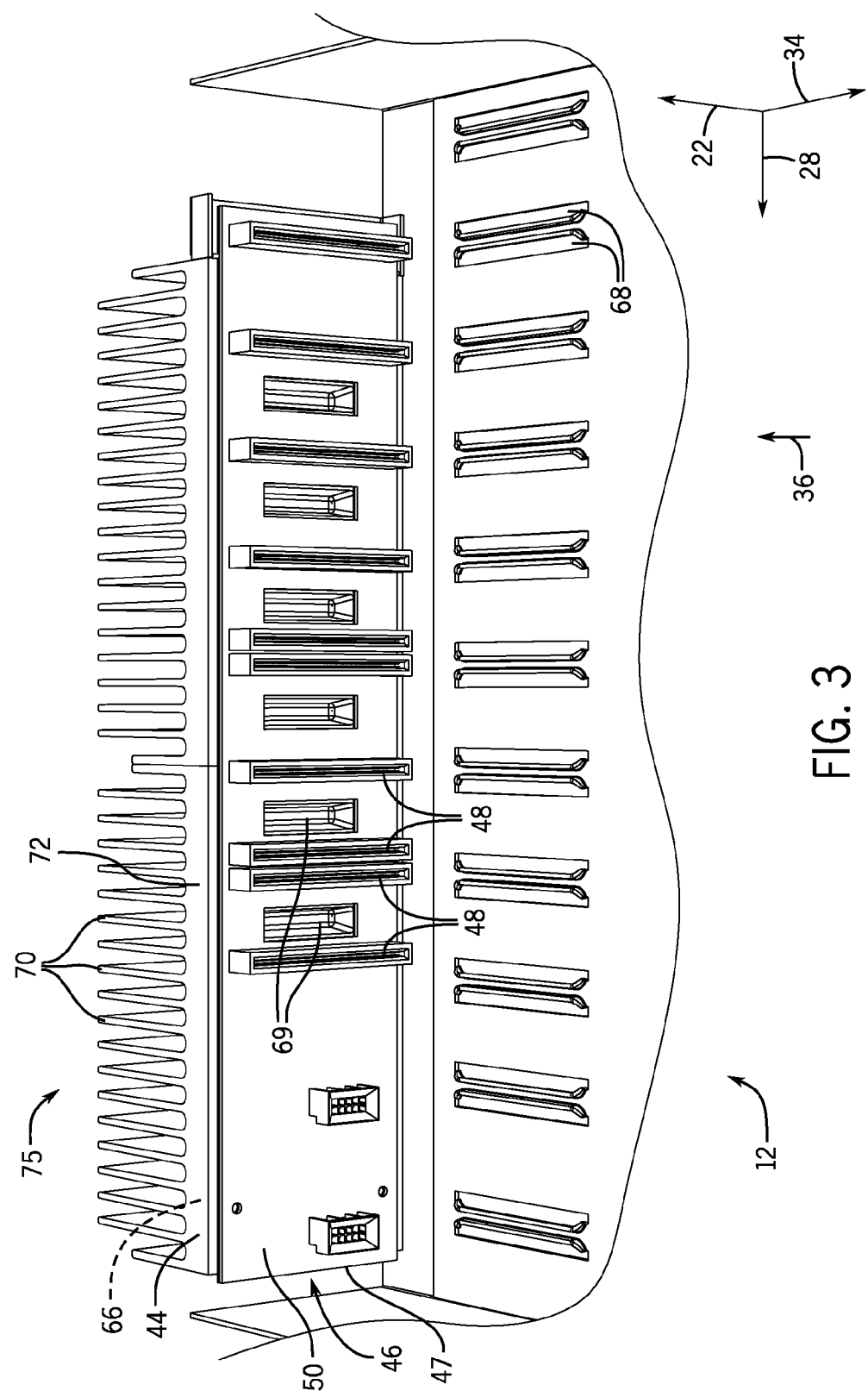
FIG. 3 is a perspective view of an embodiment of a heat sink disposed proximate to a backplane assembly of the electrical unit of FIG. 2.

FIG. 3 is a perspective view of an embodiment of the heat sink 44 disposed proximate to the backplane assembly 46 of the electrical unit 12 of FIG. 2. Indeed, as noted above, the heat sink 44 is disposed adjacent to the backplane assembly 46 of the electrical unit 12, such that it is parallel to the rear surface 66 (opposite the forward surface 50) of the backplane 47. In certain embodiments, the backplane assembly 46 of the electrical unit 12 includes one or more electrical connectors 48 organized parallel to one another. The electrical connectors 48 may be configured to form an electrical connection with electrical modules 14 inserted into the unit 12. It should be noted that the heat sink 44 may be configured as a straight fin radiator, as depicted in the illustrated drawings, or may be disposed in other heat sink 44 configurations (e.g., pin fin heat sinks, solid heat sinks, etc.) in other embodiments.

As noted above, one or more electrical modules 14 are inserted into the electrical unit 12 in the first direction 36 towards the backplane assembly 40. In particular, each electrical module 14 includes one or more pins (e.g., pins on a card edge of a circuit board) configured to form an electrical connection with an associated electrical connection 48 on the backplane assembly 46. Further, each electrical module 14 may be coupled to a heat spreader (as further illustrated and described with respect to FIGS. 4-6) configured to operatively couple to the heat sink 44. In particular, one or more rows of card guides 68 of the electrical unit 12 are configured to guide the electrical modules 14 into the electrical connection 48 and/or the heat sink 44. The card guides 68 may be a protruding ridge disposed on a surface of the electrical module 14 and/or on the surface (e.g., top surface 58, bottom surface 60) of the electrical unit 12. In some embodiments, the card guides 68 are utilized to facilitate the proper alignment of the module 14 within the unit 12, and to help guide the module 14 as it is inserted from the front to the back end 18 of the rack 10. In addition, the backplane assembly 46 may include one or more apertures 69 of the backplane 47 through which a heat spreader (illustrated in FIGS. 4-6) coupled to each electrical module 14 is operatively coupled to the heat sink 44, as further described with respect to FIG. 5.

The heat sink 44 is configured to receive the heat transferred from one or more electrical components disposed on the electrical modules 14 via the heat spreader. Accordingly, the heat sink 44 may be configured as a passive heat exchanger that cools the electrical components disposed on the modules 14 by dissipating heat into the surrounding medium (e.g., air, ambient environment). The heat sink 44 may be configured to increase the amount of surface area in contact with the surrounding medium, in order to increase the amount of heat transferred into the surrounding medium. In some situations, the heat sink 44 includes one or more fins 70 or pins that extend from a base 72.

The fins 70 receive heat from the one or more electrical modules through the base 72, and the fins 70 dissipate the heat through surfaces 75 of the fins 70 and into the surrounding medium. The geometrical features of the fins 70 may be varied, such that the fins 70 are configured in any size, shape or configuration, and the heat sink 44 may have a variable amount of space between each fin 70. Accordingly, the fins 70 may be optimized in size, shape, location, and/or configuration in order to improve the heat transfer and dissipation of the heat dissipation system 42. For example, in some situations, the shape and/or cross-sectional shape of the fins 70 may be cylindrical, elliptical, rectangular, or square, depending on the amount and type of heat transfer desired. The fins 70 extend from the base 72 in the first direction 36 along the X-axis 28. In some embodiments, the fins 70 are oriented in a vertical direction along the Y-axis 22 (as illustrated in FIG. 3) or in a horizontal direction along the Z-axis 34. Additionally, or in the alternative, the fins 70 may extend from the base 72 in a fan orientation relative to the back surface 56 of the electrical unit 12, or in a perpendicular orientation relative to the back surface 56. Likewise, the amount of surface area provided by the surfaces 75 of the fins 70, the quantity of fins 70, the amount of space between each fin 70, the orientation of the fins 70 relative to the base 72 and to the electrical unit 12, and so forth, may all be varied depending on the amount of heat transfer desired. The heat sink 44 (e.g., base 72, fins 70) may be formed from any material that has high thermal conductivity values, such as, for example, aluminum alloys, copper alloys, diamond, composite materials (copper-tungsten pseudoalloy, e-material, etc.), and so forth. The process utilized to form the heat sink 44 may include, but is not limited to, a casting process, a extrusion process, a machining process, or any combination thereof.

Figure 4:
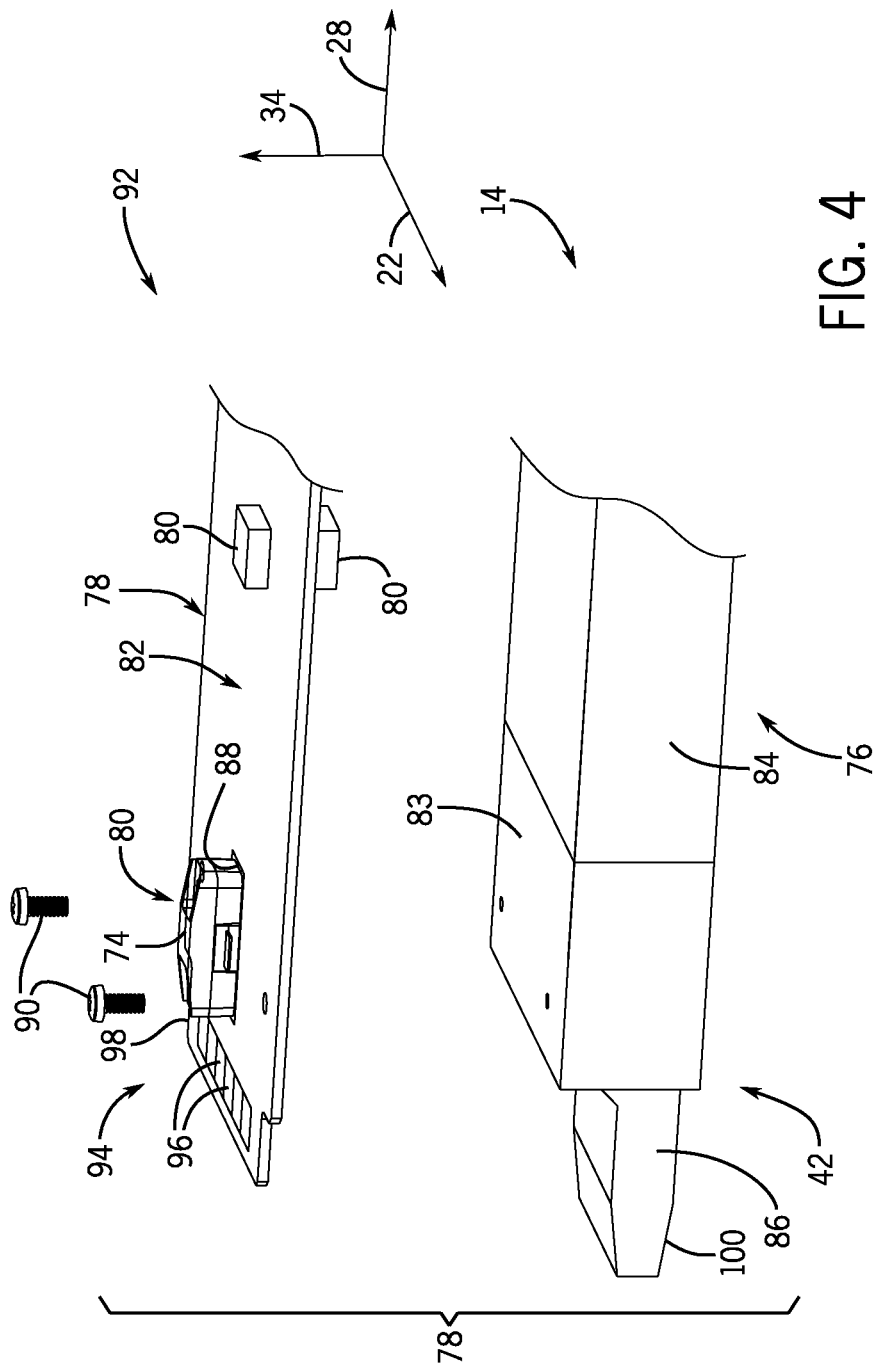
FIG. 4 is a schematic of an embodiment of an electrical module of FIG. 3, illustrating a heat generating structure of the electrical module operatively coupled to a heat spreader.

FIG. 4 is a schematic of an embodiment of the electrical module 14 of FIG. 3, illustrating a heat generating structure 74 (e.g., radio transmitter, resistive element, antenna, processor) of the electrical module 14 coupled to a heat spreader 76. The heat spreader 76 may be formed from any material that has high thermal conductivity values, such as, for example, aluminum alloys, copper alloys, diamond, composite materials (copper-tungsten pseudoalloy, e-material, etc.), and so forth. The process utilized to form the heat spreader 76 may include, but is not limited to, a casting process, a machining process, or any combination thereof. In certain embodiments, the electrical modules 14 may be a printed circuit board (PCB) assembly 78 that structurally supports one or more electrical components 80 via one or more conductive tracks, pads or features etched onto a surface 82 of the PCB assembly 78. In some embodiments, some of these electrical components 80 are heat generating structures 74, such as any heat generating electrical structure 74. In particular, one or more heat generating structures 74 disposed on the PCB assembly 78 may be coupled to a component of the thermal dissipation system 42. Specifically, one or more heat generating structures 74 disposed on the PCB assembly 78 may be operatively coupled to a heat spreader 76 (e.g., heat spreader plate, heat sink plate, etc.) of the thermal dissipation system 42, as further described below.

In certain embodiments, the PCB assemblies 78 may be single sided, double sided or multi-layered structures. Further, the heat generating structures 74 disposed on any surface (e.g., front, back, top, bottom surfaces) of the PCB assembly 78 may be directly or indirectly attached to a flat surface 83 on the heat spreader 76. The heat spreader 76 includes a body portion 84 and a shank portion 86. In certain embodiments, the heat generating structures 74 are coupled to a flat surface 83 on the body 84 of the heat spreader 76 through one or more apertures 88 on the PCB assembly 78. Indeed, direct contact between the heat generating structure 74 and the heat spreader 76 may improve the amount of heat transfer between the heat generating structure 74 and the heat spreader 76, at least in part because one or more thermal junctions between the heat generating structure 74 and the heat spreader 76 are eliminated. In some embodiments, other forms of attachments may be utilized to couple the heat generating structures 74 with the heat spreader 76. For example, in certain embodiments, indirect contact may be established between the heat generating structure 74 and the heat spreader 76 via one or more thermally conductive attachment devices 90, a thermally conductive adhesive, a thermally conductive tape, a thermally conductive paste, or any combination thereof. In some embodiments, the thermally conductive attachment devices 90 facilitate direct contact between a first portion of the heat generating structure 74 and a second portion of the heat spreader 76, such as to the flat surface 83 on the heat spreader 76.

In certain embodiments, the PCB assembly 78 has a front side 92 and a back side 94, such that the back side 94 is inserted into the unit 12 from the front surface 54 of the electrical unit 12 to the back surface 86 of the electrical unit 12 (e.g., in the first direction 36). The back side 94 of the PCB assembly 78 includes one or more pins 96 disposed along a protruding edge 98 (e.g., a card edge of a circuit board). As noted above, each of the one or more pins 96 is configured to form an electrical connection with a corresponding electrical connector 48 on the backplane 47. Furthermore, in certain embodiments, the heat spreader 76 includes a body portion 84 and a shank portion 86. The shank portion 86 protrudes from a back side 99 of the body 84 of the heat spreader 76, and includes a tapered edge 100 or a tapered coupling 100. The shank portion 86 may be substantially parallel to the protruding edge 98 of the PCB assembly 78, thereby facilitating the thermal connection of the protruding edge 98 with the heat sink 44 with the electrical connection of the one or more pins 96 with corresponding electrical connectors 48 when the electrical module 14 is inserted in the first direction 36 into the electrical unit 12. In some embodiments, the thermal connection between the heat spreader 76 and the heat sink 44 is formed at approximately the same time as the electrical connection between the PCB assembly 78 and the backplane assembly 46 when the electrical module 14 is inserted into the electrical unit 12. As further described with respect to FIGS. 5 and 6, the tapered edge 100 of the shank portion 86 of the heat spreader 76 is configured to be operatively coupled to the heat sink 44, such as in direct contact between the tapered edge 100 and the heat sink 44.

Figure 5:
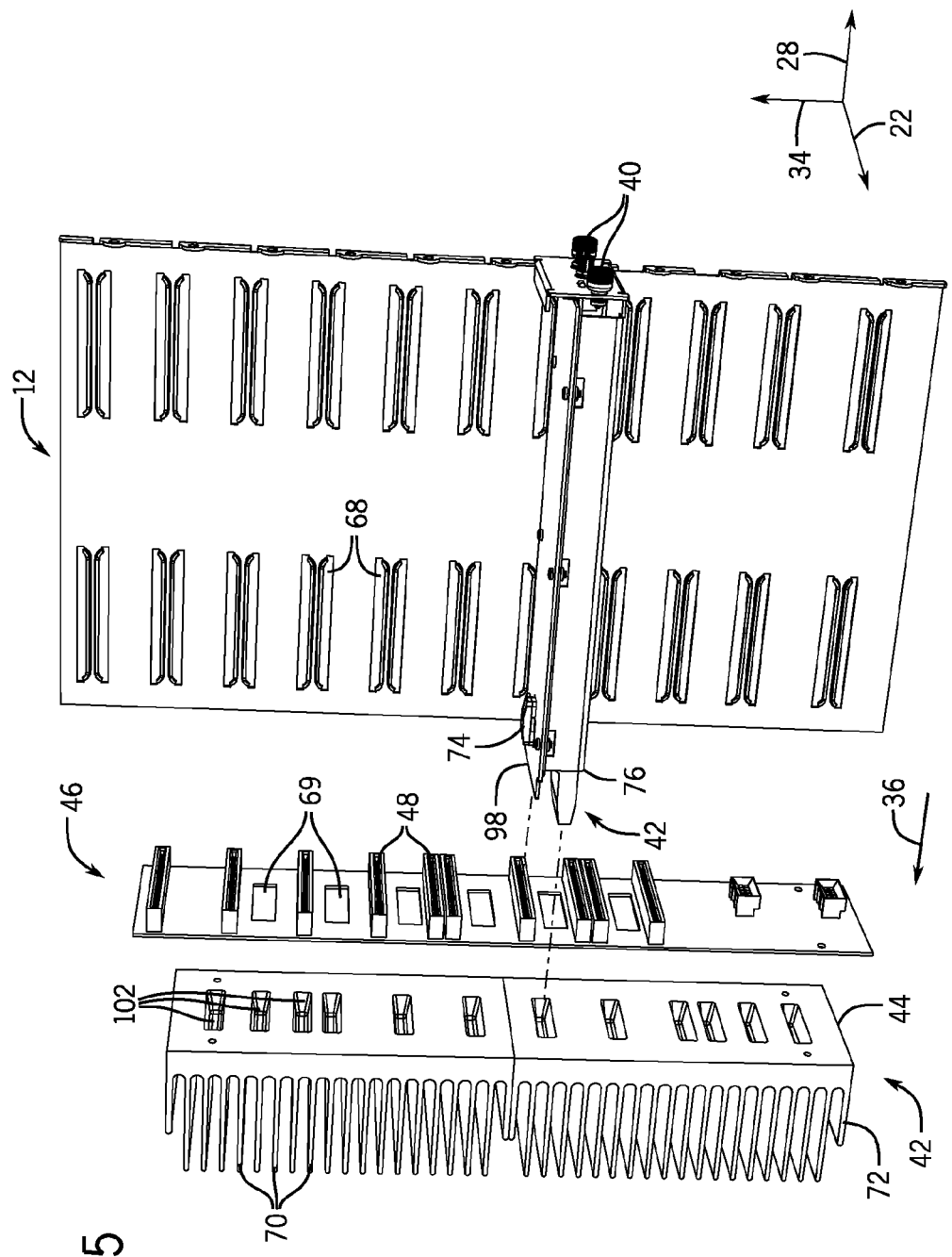
FIG. 5 is a schematic of an embodiment of the heat spreader of FIG. 4 operatively coupled to the heat dissipation device of FIG. 2 through one or more apertures within the backplane of the electrical enclosure of FIG. 1.

FIG. 5 is a schematic of an embodiment of the heat spreader 76 of FIG. 4 operatively coupled to the heat sink 44 of FIG. 2 through one or more apertures 69 within the backplane assembly 46 of the electrical unit 12. As noted above, the thermal dissipation system 42 includes the heat spreader 76 and the heat sink 44. In particular, the heat spreader 76 includes one or more tapered edges 100 on the shank portion 86 that operatively couple with one or more matching tapered sockets 102 disposed in the heat sink 44. In other words, the tapered edges 100 on the shank portion 86 and the one or more matching tapered sockets 102 on the heat sink 44 are any type of coupling that are configured to operatively couple, mate, and/or bond with one another. The interface of the one or more tapered edges 100 of the heat spreader 76 with the sockets 102 on the heat sink 44 establishes a thermal coupling, interaction, or bond or thermal coupling between the two, and facilitates the transfer of heat from the heat generating components 74 disposed on the PCB assembly 78 to the fins 70 disposed on the heat sink 44. As may be appreciated, each tapered edge 100 of a heat spreader 76 is configured to be inserted into a substantially complementary tapered socket 102 of the heat sink 44. In some embodiments, each of the tapered edges 100 of the heat spreaders 76 may have approximately the same dimensions and shape, and each of the sockets 102 of the heat sink 44 may have approximately the same corresponding dimensions and shape. For example, the tapered edges 100 of heat spreaders 76 thermally coupled to radio modules and to power supply modules may have approximately the same dimensions and shape. In this manner, the spacing, the size, the shape, the position, and other geometrical variations of the tapered features (e.g., edges or sockets) may be utilized. For example, the geometry of the tapered edges 100 or the tapered sockets 102 may be utilized as a guide, a snap-lock feature, a lock-key feature, or the like, to help with proper positioning and alignment. Alternatively, the tapered edges 100 of the heat spreaders 76 coupled to a power supply electrical module 14 may have different dimensions and shape than the tapered edges 100 of the heat spreaders 76 coupled to a radio communications electrical module 14. Accordingly, the dimensions and shape of the sockets 102 of the heat sink 44 may correspond to the particular configuration of electrical modules 14 mounted within the electrical unit 12. It should be noted that the tapered edges may be configured with any shape or size, so long as an interference fit for at least part of the heat spreader 76 with the corresponding socket 102 is feasible between the two portions of the thermal dissipation system 42.

As noted above, the tapered edges 100 of the shank portion 86 are operatively coupled with the tapered sockets 102 on the heat sink 44. In particular, tapering the mating surfaces of the shank portion 86 and the socket 102 increases the thermal bond or thermal coupling and heat transfer by increasing the contact surface area between the heat spreader 76 and the heat sink 44 relative to non-tapered surfaces (e.g., surfaces normal to the base 72 of the heat sink 44). Furthermore, the tapered mating surfaces may aid in the alignment of the module 14 within the unit 12, may aid in the alignment of the one or more pins 96 configured to form an electrical connection with the one or more electrical connectors 48 on the backplane assembly 46, and may aid in the alignment of the tapered edges 100 of the shank portion 86 within the tapered sockets 102 on the heat sink 44. In addition, the tapered edges 100 and the tapered sockets 102 facilitate an interference fit between the tapered edges 100 and the tapered sockets 102, thereby ensuring direct contact between the shank portion 86 of the heat spreader 76 and the heat sink 44. In other embodiments, the tapered edges 100 and the tapered sockets 102 facilitate any types of fit that increase and/or improve the physical contact (e.g., surface area contact) between the shank portion 86 of the heat spreader 76 and the heat sink 44, such as compression fits.

It should be noted that in certain embodiments, the tapered edges 100 and the tapered sockets 102 may be in a reversed position, such that the tapered edges 100 are disposed on the heat spreader 76 and the tapered sockets 102 are disposed on the heat sink 44. In addition, in certain embodiments, each enclosure 10 may include any configuration of the tapered edges 100 and tapered sockets 102, such that the tapered edges 100 are disposed on both the heat sink 44 and the heat spreader 76.

As noted above, the heat sink 44 is disposed substantially adjacent to the backplane assembly 46 of the electrical unit 12, such that it is parallel to a rear surface 66 of the backplane 47. The tapered sockets 102 are disposed within the base 72 of the heat sink 44. Furthermore, the one or more tapered sockets 102 may be aligned with the one or more corresponding apertures 69 disposed in the backplane assembly 46. In particular, the shank portion 86 of the heat spreader 76 is guided (via the card guides 68) in the first direction 36 through the one or more apertures 69 within the backplane assembly 46 to operatively couple with the tapered sockets 102 of the heat sink 44.

In certain embodiments, upon initial engagement of the tapered edge 100 with the tapered socket 102, the shank portion 86 of the heat spreader 76 is configured to self-align with the socket 102 to ensure that the two surfaces form a secure thermal coupling or interaction. Further, in certain embodiments, the retention devices 40 may be utilized to secure the thermal coupling, interaction, or bond between the shank portion 86 and the tapered socket 102. For example, the retention devices 40 may exert a force along the X-axis 34 to urge the tapered edge 100 of the heat spreader 76 into contact with the tapered socket 102. That is, the retention devices 40 may compress the heat spreader 76 between the heat sink 44 and the front surface 56 of the electrical unit 12. In some embodiments, the retention devices 40 may compress the electrical module 14 between the backplane assembly 46 (e.g., electrical connectors 48)

and the front surface 56 of the electrical unit 12. Accordingly, in some situations, the retention devices 40 may be utilized to secure both the thermal coupling, interaction, or bond between the heat spreader 76 and the heat sink 44, and to secure and the electrical module 14 to electrical unit 12.

Accordingly, the components of the thermal dissipation system 42 (e.g., the heat spreader 76, the heat sink 44, etc.) are configured to facilitate the transfer of heat away from the heat generating structure 74 on the electrical module 14 and to the surround medium (e.g., air) of the electrical rack 10. Specifically, the heat is transferred from the heat generating structure 74 on the module 14 (e.g., PCB assembly 78) to the body portion 84 of the heat spreader 76 via one or more apertures 88 disposed on the electrical module 14. Further, the heat is transferred from the body portion 84 of the heat spreader 76 to the shank portion 86 and the tapered edges 100 of the heat spreader 76. In addition, upon engagement the thermal connection between the heat spreader 76 and the heat sink 44, the heat is transferred from the tapered edges 100 of the shank portion 86 to the tapered sockets 102 disposed within the base 72 of the heat sink 44. Furthermore, the heat is transferred from the base 72 to the one or more fins 70 of the heat sink 44, which transfer the heat into the surround medium via one or more surfaces 75 of the fins 70. In some embodiments, engagement of the heat spreader 76 with the heat sink 44 also forms an electrical connection between the electrical module 14 and the backplane 47 via one or more pins 96 and one or more electrical connectors 48.

In this manner, the thermal dissipation system 42 may be configured to dissipate approximately 20-40 watts of heat per electrical module 14, and 150 watts to 200 watts of heat per electrical unit 12. In certain embodiments, additional features or techniques may be utilized to optimize or maximize the amount of heat transferred from the heat generating structures 74. For example, in some situations, thermal greases, gels, pastes, or compounds may be utilized to fill any gaps between the heat spreader 76 and the heat sink 44, any air gaps between the heat generating structures 74 and the body portion 84 of the heat spreader 76, or any combination thereof, thereby facilitating improved efficiency of the heat transfer.

Figure 6:
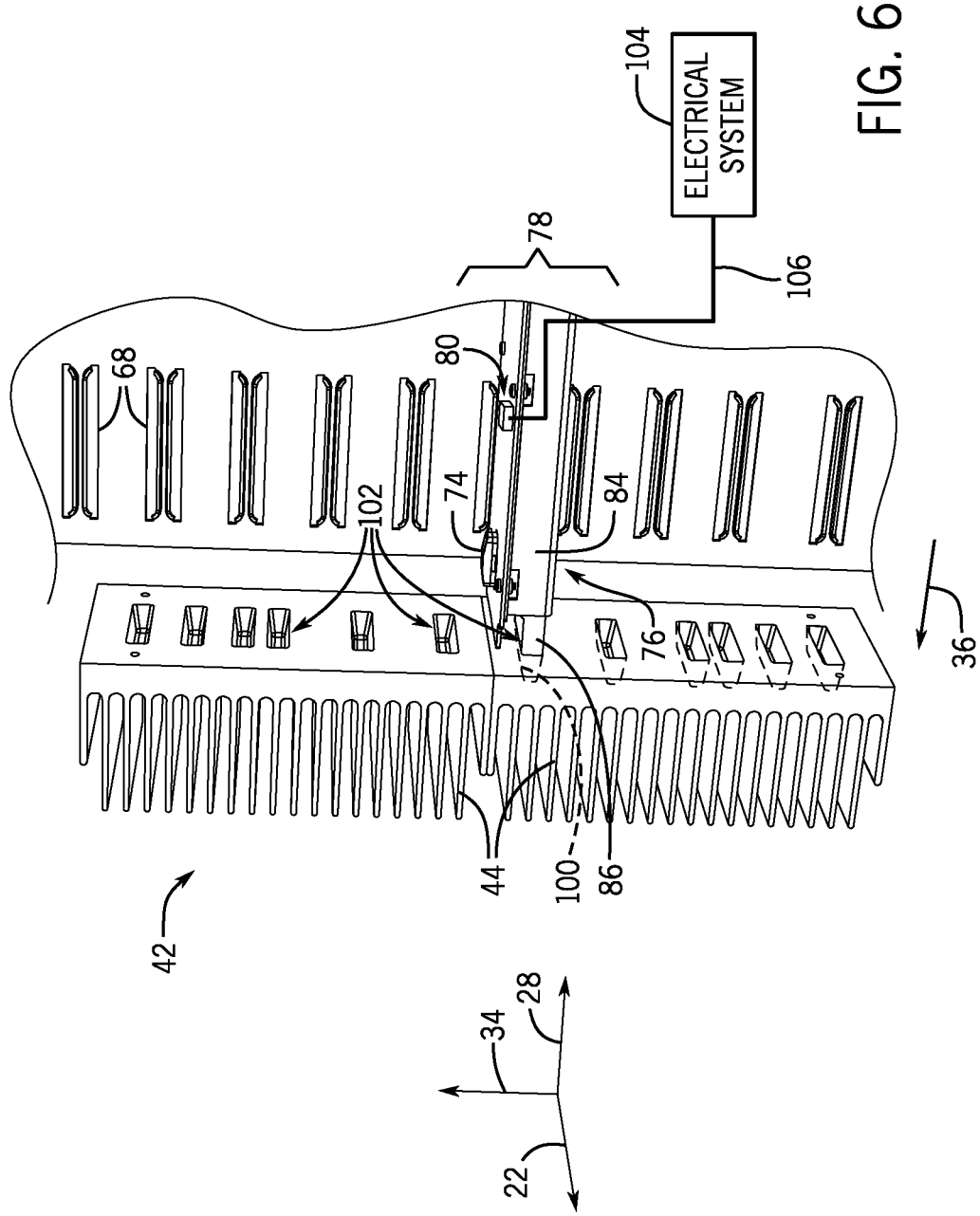
FIG. 6 is a schematic of an embodiment of the heat spreader of FIG. 4 operatively coupled to the heat dissipation device of FIG. 2.

FIG. 6 is a schematic of an embodiment of the heat spreader 76 of FIG. 4 directly coupled to the heat sink 44 of FIG. 2. As noted above, in certain embodiments, the heat sink 44 is disposed substantially parallel to the backplane 47 of the electrical unit 12, and the one or more tapered sockets 102 are aligned with the corresponding one or more apertures 69 disposed in the backplane assembly 46. In such embodiments, the shank portion 86 of the heat spreader 76 is guided in the first direction 36 through the one or more apertures 69 within the backplane assembly 46 to operatively couple with the tapered sockets 102 of the heat sink 44. However, in the illustrated embodiment, the shank portion 86 of the heat spreader 76 is guided in the first direction 36 to directly to couple with the tapered sockets 102 without an intermediary backplane assembly 46. In such embodiments, the one or more electrical components 80 disposed on the electrical module 14 (e.g., the PCB assembly 78) may be configured to form electrical connections with an electrical system 104 separate from insertion of the electrical module 14 into the electrical unit 12. For example, a cable assembly 106 may facilitate a separate connection of one or more electrical components 80 to the electrical system 104.

Technical effects of the invention include a thermal dissipation system 42 that may be utilized with electrical equipment, and more specifically, that may be utilized with electrical communications equipment. In particular, the thermal dissipation system 42 includes a heat spreader 76 and a heat sink 44, and is utilized to dissipate heat generated by one or more electrical components 80 disposed on the electrical module 14. Specifically, the heat generating structures 74 disposed on any surface (e.g., front, back, top, bottom surfaces) of the electrical module 14 may be directly or indirectly attached to a flat surface on the heat spreader 76. Further, one or more tapered edges 100 of the shank portion 86 of the heat spreader 76 is configured to be operatively coupled to the one or more tapered sockets 102 disposed within the heat sink 44. The heat sink 44 is disposed along the back surface 56 of the electrical unit 12 and the back end 18 of the electrical rack 10. In this manner, the components of the thermal dissipation system 42 (e.g., the heat spreader 76, the heat sink 44, etc.) are configured to facilitate the transfer of heat away from the heat generating structure 74 on the electrical module 14 and to the surround medium (e.g., air) of the heat sink 44 disposed at the back surface 56 of the electrical unit 12 and the back end 18 of the electrical rack 10.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system, comprising:
an electrical enclosure;
a first electrical unit removably disposed within the electrical enclosure, wherein the first electrical unit comprises a first surface opposite to a second surface;
a first electrical module removably disposed within the first electrical unit, wherein the first electrical module is inserted into the first electrical unit in a first direction from the first surface to the second surface;
a first heat spreader coupled to the first electrical module within the first electrical unit, wherein the first heat spreader comprises a first tapered coupling;
a heat sink comprising a second tapered coupling, wherein the heat sink is parallel to the second surface of the first electrical unit, and the second tapered coupling is configured to operatively couple with the first tapered coupling of the first heat spreader to form a physical thermal connection that facilitates heat transfer between the first electrical module and the heat sink; and
a backplane between the first heat spreader and the heat sink such that the backplane is adjacent to the second surface.

2. The system of claim 1, wherein the first electrical module comprises a heat generating structure coupled to the first heat spreader.

3. The system of claim 1, wherein the first heat spreader comprises a body portion and a shank portion, and wherein the shank portion comprises the first tapered coupling.

4. The system of claim 1, wherein the heat sink comprises one or more fins configured to dissipate heat into a surrounding medium.

5. The system of claim 1, comprising one or more retainers configured to secure the physical thermal connection between the second tapered coupling of the heat sink and the first tapered coupling of the first heat spreader.

6. The system of claim 1, wherein the backplane is disposed within the first electrical unit, and wherein the backplane is parallel to the heat sink.

7. The system of claim 6, wherein the backplane comprises one or more electrical connectors configured to form an electrical connection with the first electrical module when the first tapered coupling of the first heat spreader forms the physical thermal connection with the second tapered coupling of the heat sink.

8. The system of claim 6, wherein the heat sink is adjacent to a back surface of the backplane, and wherein the backplane comprises a first aperture, and the first tapered coupling is aligned with the first aperture of the backplane.

9. The system of claim 1, comprising:
a second electrical unit removably disposed within the electrical enclosure;
a second electrical module removably disposed within the second electrical unit, wherein the second electrical module is inserted into the second electrical unit in the first direction; and
a second heat spreader coupled to the second electrical module within the second electrical unit, wherein the second heat spreader comprises a third tapered coupling, and wherein the heat sink comprises a fourth tapered coupling configured to operatively couple with the third tapered coupling of the second heat spreader to form a second physical thermal connection that facilitates heat transfer between the second electrical module and the heat sink.

10. The system of claim 1, wherein the first electrical module comprise a radio module, a power supply module, a communications module, or any combination thereof.

11. A system, comprising:
an electrical unit comprising a first surface opposite a second surface;
a plurality of electrical modules disposed within the electrical unit, wherein each electrical module of the plurality of electrical modules comprise a heat generating structure;
a plurality of heat spreaders, wherein each heat spreader of the plurality of heat spreaders is coupled to a respective electrical module of the plurality of electrical modules and to a corresponding heat generating structure, wherein each heat spreader comprises:
a body portion comprising a flat surface, wherein the flat surface is in thermal contact with at least a portion of the corresponding heat generating structure; and
a shank portion comprising one or more protruding couplings;
a heat sink disposed parallel to the second surface of the electrical unit, wherein the heat sink comprises a plurality of couplings configured to operatively couple with the one or more protruding couplings of the plurality of heat spreaders to form a physical thermal connection that facilitates heat transfer between the plurality of electrical modules and the heat sink; and
a backplane adjacent to the second surface and between the plurality of heat spreaders and the heat sink.

12. The system of claim 11, wherein each electrical module of the plurality of electrical modules is removably inserted into the electrical unit from the first surface to the second surface in a first direction.

13. The system of claim 11, comprising a plurality of retainers are configured to secure the physical thermal connection between the one or more protruding couplings of the plurality of heat spreaders and the plurality of couplings of the heat sink.

14. The system of claim 11, wherein the one or more protruding couplings of the shank portion of each heat spreader of the plurality of heat spreaders are configured to form complementary pairs with the plurality of couplings to provide an interference fit between the complementary pairs.

15. The system of claim 11, wherein the plurality of electrical modules comprises one or more radio modules, one or more power supply modules, one or more communications modules, or any combination thereof.

16. A method, comprising:
inserting an electrical module into an electrical unit in a first direction from a first surface of the electrical unit to a second surface of the electrical unit, wherein the first surface is opposite to the second surface, and wherein the electrical module comprises one or more pins and a heat spreader;
establishing an electrical connection between the one or more pins of the electrical module and an electrical connector disposed on a backplane assembly of the electrical unit, wherein the backplane assembly is adjacent to the second surface of the electrical unit and is oriented parallel to and proximate to the second surface of the electrical unit, such that the backplane assembly is between the heat spreader and a heat sink; and
establishing a thermal connection between the heat spreader and the heat sink disposed adjacent to a second surface of the backplane assembly, wherein one or more protruding couplings of the heat spreader are configured to interface with one or more couplings disposed within heat sink.

17. The method of claim 16, wherein establishing the thermal connection comprises inserting the one or more protruding couplings of the heat spreader through one or more apertures of the backplane assembly and into the couplings disposed within the heat sink.

18. The method of claim 16, comprising securing the electrical connection and the thermal connection with one or more retainers, wherein the one or more retainers are configured to removably mount the electrical module within the electrical unit.

19. The method of claim 16, comprising coupling the heat spreader to one or more heat generating structures prior to inserting the electrical module into the electrical unit with one or more thermally conductive attachment devices.

20. The method of claim 16, wherein establishing the electrical connection and establishing the thermal connection occur approximately simultaneously when inserting the electrical module into the first unit in the first direction.

* * * * *